United States Patent
Wesselkamper

(10) Patent No.: US 12,081,238 B2
(45) Date of Patent: Sep. 3, 2024

(54) REGISTRATION OF A PUF SIGNATURE AND REGENERATION USING A TRELLIS DECODER

(71) Applicant: Xilinx, Inc., San Jose, CA (US)

(72) Inventor: James Wesselkamper, Albuquerque, NM (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 18/084,974

(22) Filed: Dec. 20, 2022

(65) Prior Publication Data
US 2024/0204803 A1    Jun. 20, 2024

(51) Int. Cl.
*H03M 13/25* (2006.01)
*H03M 13/11* (2006.01)

(52) U.S. Cl.
CPC ...... *H03M 13/256* (2013.01); *H03M 13/1111* (2013.01)

(58) Field of Classification Search
CPC .. H03M 13/256; H03M 13/25; H03M 13/251; H03M 13/1111
See application file for complete search history.

(56) References Cited

U.S. PATENT DOCUMENTS

| | | |
|---|---|---|
| 8,981,810 B1 | 3/2015 | Trimberger |
| 9,082,514 B1 | 7/2015 | Trimberger |
| 9,225,512 B1 | 12/2015 | Trimberger |
| 9,584,329 B1 | 2/2017 | Trimberger |
| 2003/0204743 A1* | 10/2003 | Devadas ............ G06F 21/72 257/E23.179 |
| 2016/0156476 A1* | 6/2016 | Lee ............ H04L 9/0866 380/44 |
| 2018/0006813 A1* | 1/2018 | Van Der Leest ........ G09C 1/00 |
| 2019/0116052 A1* | 4/2019 | Kim ............ H04L 9/3278 |
| 2019/0130103 A1* | 5/2019 | Shen ............ H04L 9/3278 |
| 2020/0403813 A1* | 12/2020 | Suresh ............ G06F 7/584 |

(Continued)

OTHER PUBLICATIONS

Beomsoo Park, et al., "A Metal-via Resistance based Physically Unclonable Function with Backend Incremental ADC", IEEE Transactions on Circuits and Systems I: Regular Papers, Manuscript submitted Mar. 10, 2021, Department of Electrical and Computer Engineering, University of Florida, Gainesville, FL 32611 USA.

(Continued)

*Primary Examiner* — Khanh C Tran
(74) *Attorney, Agent, or Firm* — Crawford Maunu PLLC

(57) ABSTRACT

A physically unclonable function includes a circuit that translates a normally distributed sequence of raw sample into a sequence of uniformly distributed binned values across sub-bins of bins. Helper circuitry generates centering values and parity bits based on binned values generated during registration. Each centering value is associated with a raw sample value corresponding to a binned value and indicates an offset of a sub-bin in one of the bins. A distance calculator generates a set of distances from each raw sample value based on the centering value associated with the raw sample value. Each distance indicates a difference between the respective raw sample value and a raw sample value equivalent to a midpoint of a sub-bin offset by the associated centering value in a bin. A trellis decoder generates a PUF signature based on the candidate symbols, sets of distances, and parity bits.

20 Claims, 8 Drawing Sheets

(56) References Cited

U.S. PATENT DOCUMENTS

2021/0152349 A1\* 5/2021 Van Der Sluis .......... H04L 9/08
2022/0139434 A1\* 5/2022 Chang .................... G11C 16/26
711/103

OTHER PUBLICATIONS

Qianying Tang, et al., "A Physical Unclonable Function based on Capacitor Mismatch in a Charge-Redistribution SAR-ADC", Dept. of Electrical and Computer Engineering, University of Minnesota, Minneapolis, MN, USA, and Western Digital Research, CA, USA. Downloaded Dec. 6, 2022.

G. Edward Suh, et al., "Physical Unclonable Functions for Device Authentication and Secret Key Generation", DAC 2007, Jun. 4-8, 2007, San Diego, California, USA, Copyright 2007 ACM.

Rainer Falk, et al., "New Applications of Physical Unclonable Functions", International Journal on Advances in Security, vol. 9 No. 1 & 2, year 2016, http://www.iariajournals.org/security/, 2016, © Copyright by authors, Published under agreement with IARIA—www.iaria.org.

Nathan Menhorn, "External Secure Storage Using the PUF", Xilinx, XAPP1333 (v1.0) Jun. 26, 2018. www.xilinx.com.

\* cited by examiner

REGISTRATION OF A PUF SIGNATURE AND REGENERATION USING A TRELLIS DECODER

TECHNICAL FIELD

The disclosure generally relates to helper data for a physically unclonable function (PUF).

BACKGROUND

A system's identity may be established and authenticated based on the unique physical properties of the system. In some applications, physically unclonable functions (PUFs) embodied in integrated circuits (ICs) are used to exploit the unique physical characteristics of a system for purposes of authentication. Each instance of the IC will have slightly different physical characteristics due to the random variation in an IC fabrication process. A PUF circuit uses the physical characteristics to generate an identifier value, for example a binary number, which differs from one integrated circuit to the next due to the different physical characteristics of each manufactured device. These identifier values may be used to uniquely identify the integrated circuit, as a key for encryption and decryption, or for other purposes. Examples of circuits used to implement PUFs include delay circuits and ring oscillators, memory circuits, and cross-coupled latches. The terms PUF circuit and PUF may be used interchangeably herein.

Some PUFs may operate according to a challenge-response protocol. The input to a PUF is the challenge, and the output from the PUF is the response. The slight variations between instances of the PUF circuits in different systems result in the separate instances providing different responses to the same challenge. In addition to identification and authentication, PUF circuits may be used to generate volatile secret keys.

Helper data is sometimes used to compensate for instability in a PUF circuit. Since a PUF circuit relies on a physical property of a device, the PUF values may not be consistent as the device and PUF age. Since a changed PUF value may prevent authentication of a device or communication with a device, helper data in the form of an error-correcting code may be used to correct raw PUF data to the expected PUF signature. While the helper data is useful in maintaining the viability of the PUF over the life of the device, the helper data may be large and may create storage issues. In addition the helper data may also reveal information about the PUF value.

SUMMARY

A disclosed circuit arrangement includes a translator circuit configured to translate a sequence of raw sample values having a normal distribution into a sequence of initial symbols having a uniform distribution across a plurality of sub-bins of a plurality of bins. The circuit arrangement includes a distance calculator configured to generate a set of distances from each raw sample value, respectively, based on a centering value associated with the raw sample value. Each distance in each set of distances is associated with a candidate symbol identifying one bin of the plurality of bins, and indicates a difference between the respective raw sample value and a raw sample value equivalent to a midpoint uniform value of a sub-bin offset by the associated centering value in the one bin of the plurality of bins. The circuit arrangement includes a trellis decoder configured to generate a PUF signature based on the candidate symbols, sets of distances, and parity bits.

A disclosed method of registering a physically unclonable function (PUF) includes translating a sequence of raw sample values having a normal distribution into a sequence of binned values having a uniform distribution across a plurality of sub-bins of a plurality of bins by a translator circuit. The method includes generating helper data by a helper circuit and storing the helper data in a memory circuit. The helper data includes centering values, and parity bits based on the sequence of binned values. Each centering value is associated with a raw sample value corresponding to a binned value of the sequence of binned values and indicates an offset of a sub-bin in one of the plurality of bins. The method includes generating a check value based on symbols represented in the sequence of binned values by a check value generator and storing the check value in the memory circuit.

Another disclosed circuit arrangement includes a translator circuit configured to translate, in response to operating in a registration mode, a first sequence of raw sample values having a normal distribution into a first sequence of binned values having a uniform distribution across a plurality of sub-bins of a plurality of bins. The translator circuit is configured to translate, in response to operating in a regeneration mode, a second sequence of raw sample values having a normal distribution into a second sequence of binned values having a uniform distribution across the plurality of sub-bins of the plurality of bins. A memory circuit is configured to provide non-volatile storage of data. A helper circuit is configured to generate helper data and store the helper data in the memory circuit in response to operating in the registration mode. The helper data includes centering values, and parity bits based on the first sequence of binned values. Each centering value is associated with a raw sample value corresponding to a binned value of the first sequence of binned values and indicates an offset of a sub-bin in one of the plurality of bins. A check value generator is configured to generate a first check value based on symbols represented in the first sequence of binned values and store the first check value in the memory circuit in response to operating in the registration mode. A distance calculator is configured to generate, in response to operating in the regeneration mode, a set of distances from each raw sample value, respectively, based on the centering value associated with the raw sample value. Each distance in each set of distances is associated with a candidate symbol identifying one bin of the plurality of bins, and indicates a difference between the respective raw sample value and a raw sample value equivalent to a midpoint of a sub-bin offset by the associated centering value in the one bin of the plurality of bins. A trellis decoder is configured to generate, in response to operating in the regeneration mode, a PUF signature that includes a sequence of final symbols based on the candidate symbols, sets of distances, and parity bits from the memory circuit. The check value generator is configured to generate a second check value based on the sequence of final symbols in response to operating in the regeneration mode. A validation circuit is configured to indicate validity of the PUF signature based on the first check value and the second check value.

Other features will be recognized from consideration of the Detailed Description and Claims, which follow.

BRIEF DESCRIPTION OF THE DRAWINGS

Various aspects and features of the circuitry and methods will become apparent upon review of the following detailed description and upon reference to the drawings in which.

DETAILED DESCRIPTION

Figure 1:
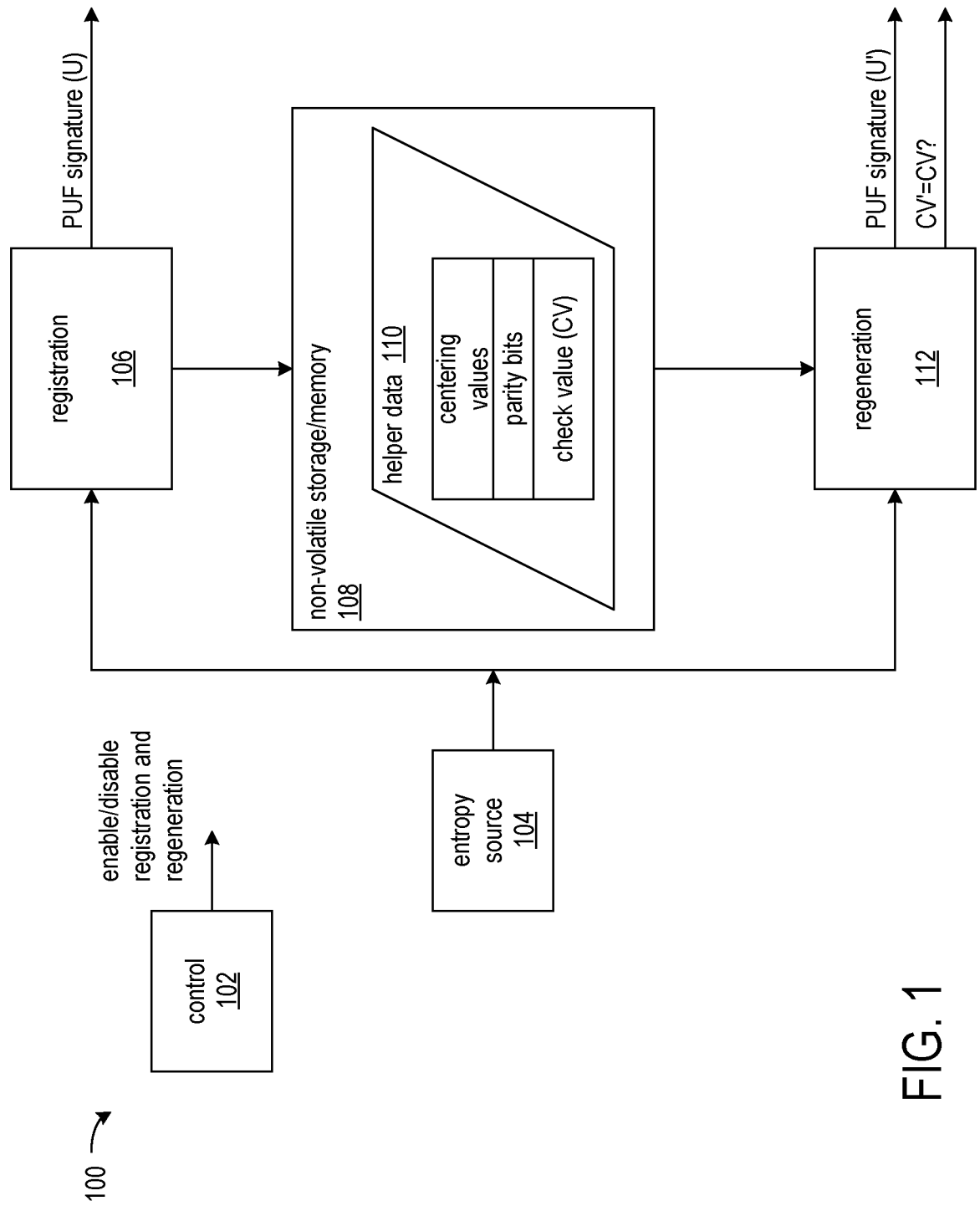
FIG. 1 shows an exemplary circuit arrangement of PUF circuitry that implements the encoding of normally distributed raw PUF data into uniformly distributed PUF symbols to produce parity bits during PUF registration, and during regeneration the decoding of uniformly distributed PUF symbols by a trellis decoder using the parity bits.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods use techniques from information theory to significantly reduce the quantity of PUF helper data and reduce information leakage of the helper data. Registration of raw PUF data can be viewed as "transmission" of the data through a noisy channel, and PUF regeneration can be viewed as "receiving" raw PUF data. The operation of a PUF can be analogized to communications channel. In a communications channel, a message W is encoded into sequence of data X, transmitted through a channel, and a sequence of data Y is received. Y can be decoded into a message, W. The message W is analogous to the PUF signature at registration; X is analogous to the PUF raw data at registration along with the associated helper data; Y is analogous to the PUF raw data at regeneration along with the associated helper data. W' is analogous to the regenerated PUF signature. The PUF is marginally different from a communication channel in that selection of W is not necessary. In a PUF, W is derived from X. To compensate, X is augmented with helper data that is transported in a noiseless sideband channel.

The entropy source, such as pairs of ring oscillators (ROs), banks of capacitors, resistance networks, etc., generates a sequence of raw sample values, which are normally distributed. The random variables can scale from sample to sample based on changes in temperature, voltage, and aging.

During registration the raw sample values, which have a normal distribution, are quantized and uniformly distributed across a number of bins based on the standard deviation of registration samples. Likewise, during regeneration the raw sample values are quantized and binned based on the standard deviation of the regeneration samples. The number of bins can vary according to application requirements, and the thresholds that define the ranges of the bins are selected such that any given sample value has an equal probability of falling within the ranges of the bins. Table 1 shows examples of the thresholds for 2, 3, 4, 5, 6, 7, and 8 bins assuming a standard deviation of 100 for non-quantized samples.

TABLE 1

| | Bin# | | | | | | | |
|---|---|---|---|---|---|---|---|---|
| #bins | 0 | 1 | 2 | 3 | 4 | 5 | 6 | 7 |
| 2 | [−∞, 0) | [0, +∞] | | | | | | |
| 3 | [−∞, −43) | [−43, 43] | (43, +∞] | | | | | |
| 4 | [−∞, −67) | [−67, 0) | [0, 67] | (67, +∞] | | | | |
| 5 | [−∞, −84) | [−84, −25) | [−25, 25] | (25, 84] | (84, +∞] | | | |
| 6 | [−∞, −97) | [−97, −43) | [−43, 0) | [0, 43] | (43, 97] | (97, +∞] | | |
| 7 | [−∞, −107) | [−107, −57) | [−57, −18) | [−18, 18] | (18, 57] | (57, 107] | (107, ∞] | |
| 8 | [−∞, −115) | [−115, −67) | [−67, −32) | [−32, 0) | [0, 32] | (32, 67] | (67, 115] | (116, +∞] |

The binning of quantized raw sample values involves converting raw values to the [0,1] domain based on the cumulative probability distribution function (CDF). The resulting values are "binned sample values" in which the most significant bits of each quantized sample value references one of the bins, and the least significant bits (LSBs) of the quantized sample value references a sub-bin of a bin.

The disclosed PUF registration circuitry generates helper data that includes centering values, parity bits, and a check value. Each raw sample value, and therefore the corresponding binned sample value, has an associated centering value. Each centering value indicates a sub-bin offset in a bin of the associated binned sample value. The number of LSBs of a binned sample value used for the centering value is based on the number of sub-bins in each bin. For example, 2 bits can reference 4 sub-bins. In an exemplary PUF that generates a sequence of 320 raw sample values and the number of sub-bins is 4, the total number of bits required for the centering values is 640 bits.

The most significant bits (MSBs) of the binned sample values are symbols that are used to generate the parity bits and the check value. The sequence of symbols is the PUF signature. According to one approach, a Recursive Systematic Convolution (RSC) encoder generates a sequence of parity bits from the symbols. The sequence of parity bits corresponds to the sequence of symbols in that each parity bit is associated with a respective one of the symbols in the sequence. In an example involving 4 bins, each symbol is 2 bits and a parity bit is generated for each symbol. The final state of the RSC encoder is returned as additional parity bits for the sequence of symbols. In an exemplary implementation having 4 bins and an RSC encoder having a constraint length K=3, the number of parity bits is 322 bits rather than 320 bits. In an exemplary implementation having 4 bins and an RSC encoder having a constraint length K=7, the number of parity bits is 326 bits.

The check value can be generated by a one-way function, such as a secure hash algorithm (e.g., SHA2 or SHA3) digest computed on the symbols by a dedicated circuit or by a processor. The size of the check value should be large enough to avoid false positives during error detection. A 24-bit check value may be sufficient to detect errors while avoiding erroneously indicating an error.

During regeneration, the PUF signature is generated from raw sample values using the centering values and parity bits that were produced in registering the PUF. A trellis decoder decodes each symbol of the PUF signature using sets of distances, which are based on the centering values and raw sample values, and the parity bits. In the exemplary system, the trellis decoder evaluates a subset (a "window") of all the sets of distances to decode one symbol value, rather than evaluating all possible paths from the sets of distances derived from all of the raw sample values in the sequence. For example, for a sequence of 320 symbols encoded using a constraint length 7, a traditional Viterbi trellis decoder would have 20,480 nodes to find the lowest cost path of all possible paths. In the sliding window trellis decoder, for a decoding window size of 14 symbols, for example, symbol i is decoded by finding the lowest cost path involving symbol i through symbol (i+13). For the sequence of 320 symbols encoded using a constraint length 7, the trellis is reduced from 20,480 nodes to 896 nodes.

Once the PUF symbols have been decoded during regeneration, a check value is computed on the sequence of decoded PUF symbols using the same function used in registering the PUF. If the regeneration check value matches the registration check value, the PUF circuitry signals that the decoded PUF signature is valid. Otherwise, the PUF circuitry signals that the decoded PUF signature is invalid.

FIG. 1 shows an exemplary circuit arrangement 100 of PUF circuitry that implements the encoding of normally distributed raw PUF data into uniformly distributed PUF symbols to produce parity bits during PUF registration, and during regeneration the decoding of uniformly distributed PUF symbols by a trellis decoder using the parity bits. The circuit arrangement 100 includes a control circuit 102, an entropy source 104, registration logic 106, non-volatile storage 108, and regeneration logic 112. Though the registration logic and regeneration logic are shown as separate blocks, it will be recognized that the registration logic and regeneration logic may share certain circuitry, such as circuitry that translates raw sample values to binned sample values that are uniformly distributed and circuitry that generates a check value.

The entropy source can be any circuit that produces an ordered set or sequence of normally distributed raw PUF sample values. The examples described herein involve 320 differences between pairs of ring oscillators ("ROs"). The control circuit 102 generally enables and disables selected logic of the PUF circuitry during PUF registration and PUF regeneration. The control circuit enables the registration logic 106 and disables the regeneration logic 112 during PUF registration, and enables the regeneration logic and disables the registration logic during PUF regeneration. The entropy source can be any circuit that generates a sequence of raw sample values in response to a sample of measurements of a physical phenomenon having a normal distribution.

The registration logic 106 generates helper data 110 and stores the helper data in the non-volatile storage/memory arrangement 108. In response to being enabled by the control circuit 102, the registration logic inputs raw PUF data (a "registration sample") from the entropy source 104 and generates centering values, parity bits and a check value ("CV" or "registration check value") as helper data 110, and then stores the helper data in non-volatile storage/memory 108. The implementation of the non-volatile storage can be based on application requirements. For example, the non-volatile storage can be disposed on-chip or off-chip relative to the registration logic 106 and/or regeneration logic 112. "On-chip" refers to the non-volatile storage being disposed on the same integrated circuit die or package as the registration logic and/or regeneration logic. "Off-chip" refers to the non-volatile storage being disposed on an integrated circuit die or package other than the registration logic and/or regeneration logic. The non-volatile storage can be implemented as e-fuses or flash memory, for example.

In order to generate the helper data 110, the registration logic 106 first translates the raw sample values to quantized, uniformly distributed values ("binned values") that correspond one-to-one to the raw sample values. The LSBs of each binned value provide an associated centering value, and the MSBs of the binned value are taken as a symbol of the PUF signature (U). In terms of the binning of the raw PUF data, the value of the MSBs indicate a bin corresponding to a raw PUF sample value, and the value of the LSBs indicate the sub-bin of the bin. Each raw PUF sample value thereby has an associated centering value.

The registration logic performs an RSC on the values of the MSBs to generate parity bits that can be stored in the non-volatile storage 108 and later used to regenerate the PUF signature. The parity bits are respectively associated with the symbols and corresponding source sample values.

The registration logic implements a cryptographic hash function that generates the check value (CV) based on the values of the MSBs of the binned values.

The regeneration logic 112 uses the helper data 110 to regenerate a PUF signature from raw PUF data provided by the entropy source 104. The regeneration logic translates the raw sample values to quantized, uniformly distributed values ("binned values") that correspond one-to-one to the raw sample values. The MSBs of the binned values are taken as symbols to decode.

The centering values are used by the regeneration logic to generate respective sets of distances for the symbols. A trellis decoder of the regeneration logic inputs the symbols, associated sets of distances, and associated parity bits to determine lowest costs paths, and thereby the most likely final symbol values of the PUF signature.

The cryptographic hash function used by the registration logic 106 is also used by the regeneration logic 112. The cryptographic hash function generates a "regeneration check value" (CV') based on the final symbol values produced by the trellis decoder. The regeneration logic compares the registration check value (CV) to the regeneration check value (CV') and outputs a signal indicating whether or not CV is equal to CV', and thereby, whether or not the regenerated PUF signature U' is valid.

The entropy source, registration logic, and regeneration logic can all be disposed on the same integrated circuit device or package or on one or more separate integrated circuit devices or packages.

Figure 2:
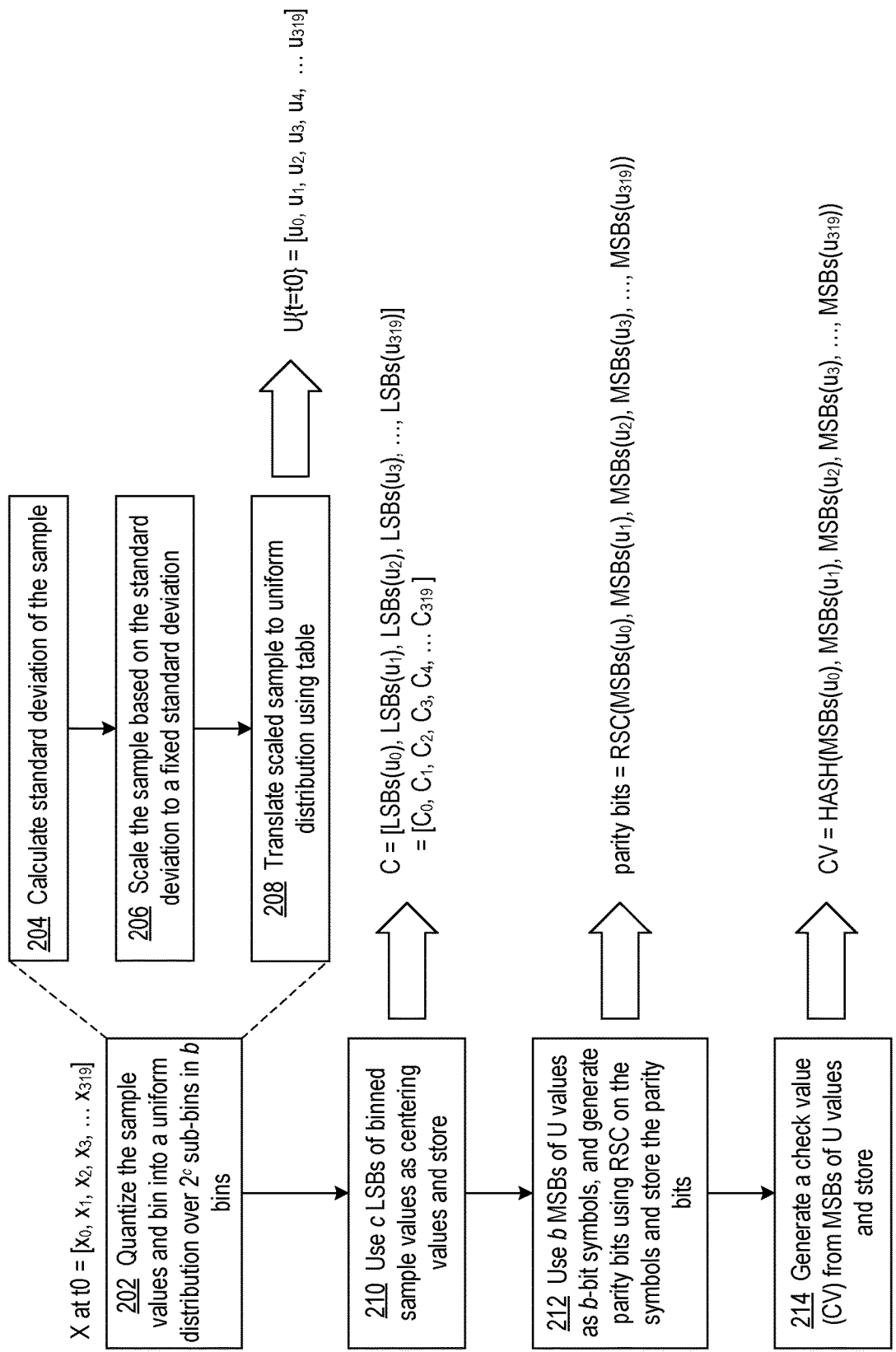
FIG. 2 shows a flowchart of an exemplary PUF registration process performed by circuitry that implements the registration logic.

FIG. 2 shows a flowchart of an exemplary PUF registration process performed by circuitry that implements the registration logic 106 (FIG. 1). At block 202, the sample values of raw PUF data are quantized into a uniform distribution over $2^c$ sub-bins of $2^b$ bins. "X" denotes the sample at registration time t, and the raw sample values in the exemplary sequence are denoted $x_0, \ldots, x_{319}$. Note that the c LSBs in each binned value references a sub-bin, and the b MSBs of each binned value reference a bin.

The binning of the raw sample values can be accomplished by quantizing the raw sample values to a suitable domain, for example, [−512, 511] and calculating the standard deviation of the quantized sample values at block 204. At block 206, the quantized values are scaled to a fixed standard deviation (e.g., 100) based on the computed standard deviation. At block 208, the scaled sample values are translated to a uniform distribution using a look-up table that converts the scaled sample values from the quantized [−512, +511] domain to the [0,1] domain based on the CDF function and the fixed standard deviation. The uniformly distributed sample is denoted U, and the uniformly distributed binned values in the exemplary sequence are denoted $u_0, \ldots, u_{319}$. The number of bits that represent each uniformly distributed binned sample value is b+c. The look-up table can be a memory circuit that is configured with values represented by b+c bits and addressed by values of the scaled sample values.

At block 210, the c LSBs of the binned values are extracted and stored in non-volatile storage as centering values. The sequence/ordered set of centering values associated with the registration PUF sample is denoted as "C," and each centering value is denoted $C_i$ for $0 \le i \le 319$ in the exemplary sequence.

At block 212, the MSBs of the uniformly distributed binned values are used as symbols of the PUF signature and used to generate associated parity bits by an RSC encoder. The final state of the RSC encoder indicates the parity bits associated with the symbols, and the parity bits are stored in non-volatile storage. Each symbol has an associated one of the parity bits. In generating the parity bits, the RSC encoder appends additional parity bits to the parity bits that encode the final state of the RSC encoder, and the additional parity bits are used by the trellis decoder during regeneration.

At block 214, a cryptographic hash function generates a check value, CV, based on the MSBs of the uniformly distributed binned values and stores the check value in non-volatile storage.

Figure 3:
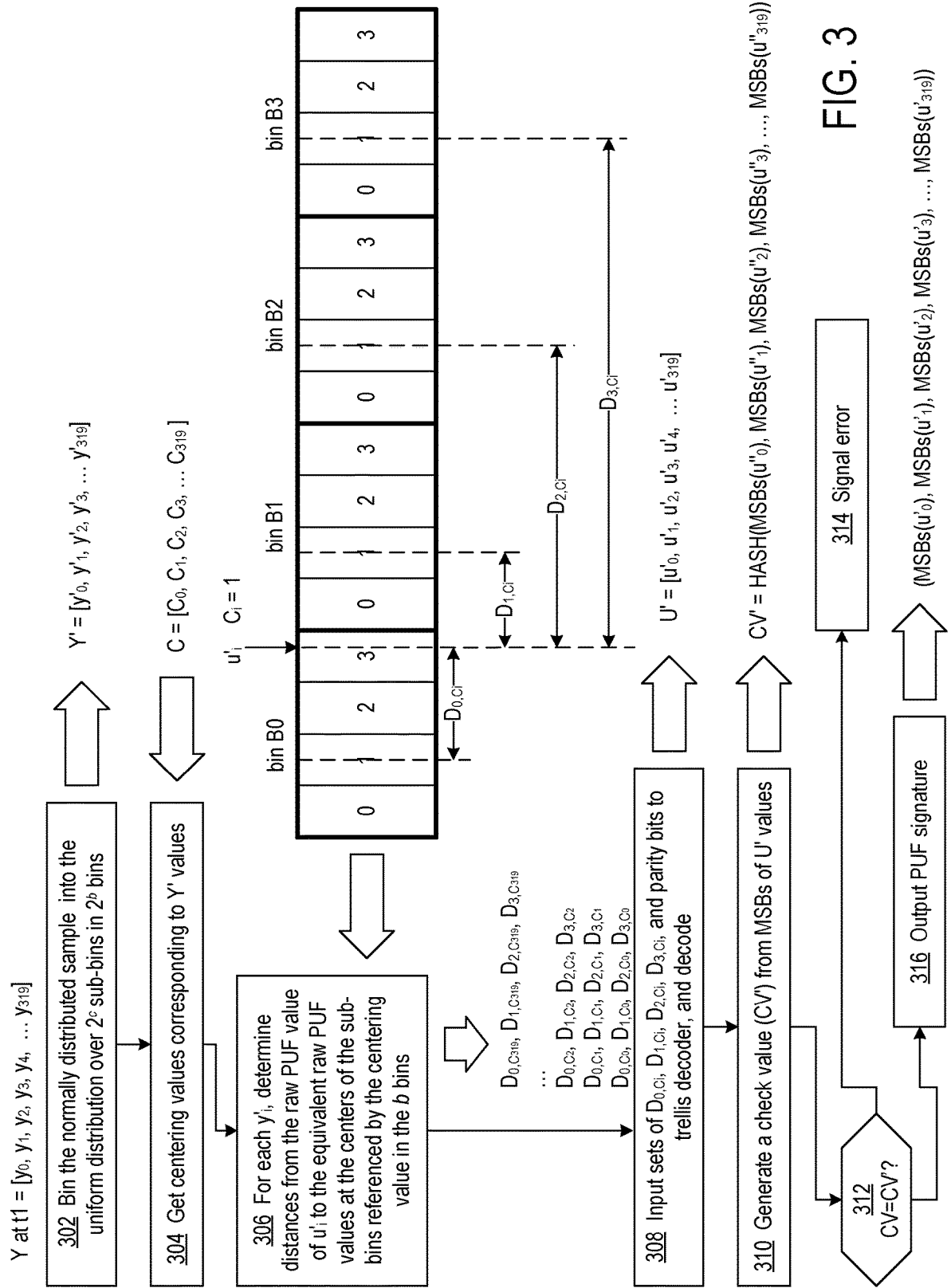
FIG. 3 shows a flowchart of an exemplary PUF regeneration process performed by circuitry that implements the PUF regeneration logic.

FIG. 3 shows a flowchart of an exemplary PUF regeneration process performed by circuitry that implements the PUF regeneration logic 112 (FIG. 1). At block 302, the sample values of raw PUF data are binned into a uniform distribution over $2^c$ sub-bins of $2^b$ bins as during the PUF registration process. "Y" denotes the sample at regeneration time t1, and the raw sample values in the exemplary sequence are denoted $y_0, \ldots, y_{319}$. The binned sample Y' has values denoted $y'_0, \ldots, y'_{319}$.

At block 304, the PUF regeneration logic reads the centering values, which were generated during PUF registration, from non-volatile storage. At block 306, the regeneration logic determines respective sets of distances associated with the binned values. For each $y'_i$, the regeneration logic determines a set of distances based on the associated, source raw sample value, the associated centering value, and a raw sample value equivalent to a midpoint uniform value of a sub-bin offset by the associated centering value in each of the bins.

FIG. 3 shows an example of a set of distances determined for the binned value $y'_i$, based on an associated centering value $C_i=1$, and 4 bins B0, B1, B2, and B3, with each bin having 4 sub-bins. Note that the sub-bins nearest the center (the division between bin B1, sub-bin 3 and bin B2, sub-bin 0) of all sub-bins represent the smallest ranges of sample values in the normal distribution, and the sub-bins represent increasing larger ranges of the normal distribution as the distance between the sub-bins and the center of the sub-bins increases. Table 1 illustrates the different ranges for bins, which correspondingly applies to the sub-bins.

The following process is used to determine each set of distances. The raw sample values equivalent to the centers of the sub-bins are used in determining the distances. The equivalent raw sample values can be computed and configured in the regeneration logic at the time a designer selects the bin thresholds.

The equivalent raw sample values at the centers of the sub-bins can be determined by using an inverse normal distribution function based on the cumulative probabilities at the centers of the sub-bins. The inverse normal distribution function works backward from the cumulative probability p to find the raw sample value equivalent to the cumulative probability at the center of a sub-bin. The inputs to the inverse normal distribution function are p, and the mean and standard deviation of the sample. In the example having 16 sub-bins, the cumulative probabilities at the centers of the sub-bins are $\frac{1}{32}, \frac{3}{32}, \frac{5}{32}, \frac{7}{32} \ldots \frac{31}{32}$. For 4 bins and 16 sub-bins that cover equivalent raw sample values in the domain [−512, 511], the inverse normal distribution function with a standard deviation of 100 generates the following equivalent raw sample values at the centers of the sub-bins: −186, −132, −101, −78, −58, −40, −24, −8, 8, 24, 40, 58, 78, 101, 132, 186.

The centering values are used to select which equivalent raw sample values to use in computing the distances. In the example, the raw sample value $y_i=-88$ falls in bin B0, sub-bin 3 and has an associated centering value $C_i=1$. The distances in the set of distances determined for u', are denoted $D_{0,C_i}, D_{1,C_i}, D_{2,C_i}, D_{3,C_i}$. The centering value $C_i=1$ references sub-bin 1 in each of bins B0, B1, B2, and B3, and the equivalent raw sample values at the centers of those sub-bins are used in determining the distances. Note that the bins correspond to the possible values for each symbol of the PUF signature. Each possible value for the symbol is referred to as a "candidate symbol," and each candidate symbol is associated with the distance determined for the corresponding bin. In the example, each candidate symbol is represented by two bits as there are four bins, and the candidate symbols are 00, 01, 10, and 11.

The equivalent raw sample values at the centers of the referenced sub-bins are denoted sub-bin_center$_{s,t}$ where s is the bin and t is the referenced sub-bin. Each distance is $|y_i-\text{sub-bin\_center}_{s,t}|$. In the example $y_i=-88$ and $C_i=1$, and the distances are:

$$44=|(-88)-(-132)|$$

$$48=|(-88)-(-40)|$$

$$112=|(-88)-24|$$

$$189=|(-88)-101|$$

Figure 5:
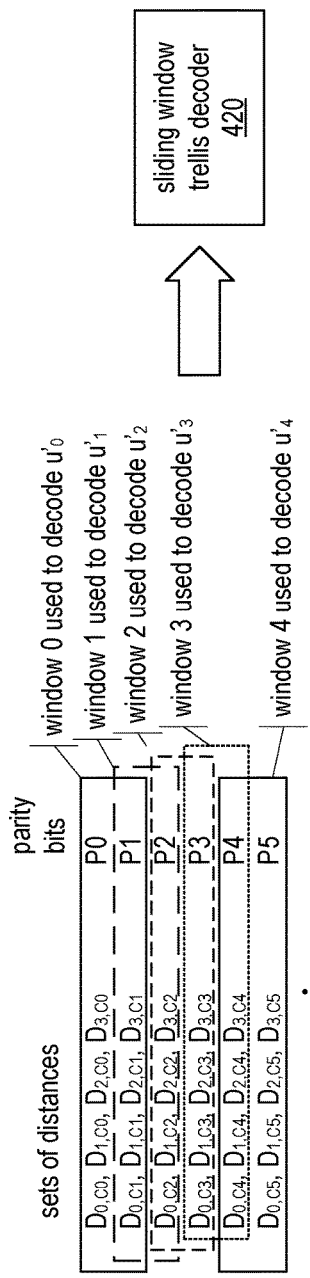
FIG. 5 shows windows of data input to an exemplary sliding window trellis decoder.

At block 308 the sets of distances, associated candidate symbols, and parity bits are input to a trellis decoder to generate the PUF signature. A feature of the disclosed regeneration logic and trellis decoder is that a sliding window over all the sets of distances, associated candidate symbols, and parity bits is used to reduce the size of the trellis and thereby reduce hardware requirements. The sliding window is illustrated in FIG. 5. Generally, to decode PUF symbol of $u'_i$, the sets of distances $D_{0,C_i}$, $D_{1,C_i}$, $D_{2,C_i}$, $D_{3,C_i}$ through $D_{0,C_{i+n-1}}$, $D_{1,C_{i+n-1}}$, $D_{2,C_{i+n-1}}$, $D_{3,C_{i+n-1}}$ and associated candidate symbols and parity bits are input to the trellis decoder, where n is the number of sets of distances in the window. In the next decoder cycle to decode PUF symbol $u'_{i+1}$, the sets of distances $D_{0,C_{i+1}}$, $D_{1,C_{i+1}}$, $D_{2,C_{i+1}}$, $D_{3,C_{i+1}}$ through $D_{0,C_{i+n}}$, $D_{1,C_{i+n}}$, $D_{2,C_{i+n}}$, $D_{3,C_{i+n}}$ and associated candidate symbols and parity bits are input to the trellis decoder.

At block 310, the regeneration logic generates a check value CV' from the decoded symbols using the same cryptographic hash function that was used in PUF registration. If the registration check value CV is equal to the regeneration check value CV, decision block 312 directs the registration logic to signal a valid PUF signature and output the decoded PUF signature at block 316. Otherwise, the regeneration logic signals an error at block 314.

Figure 4:
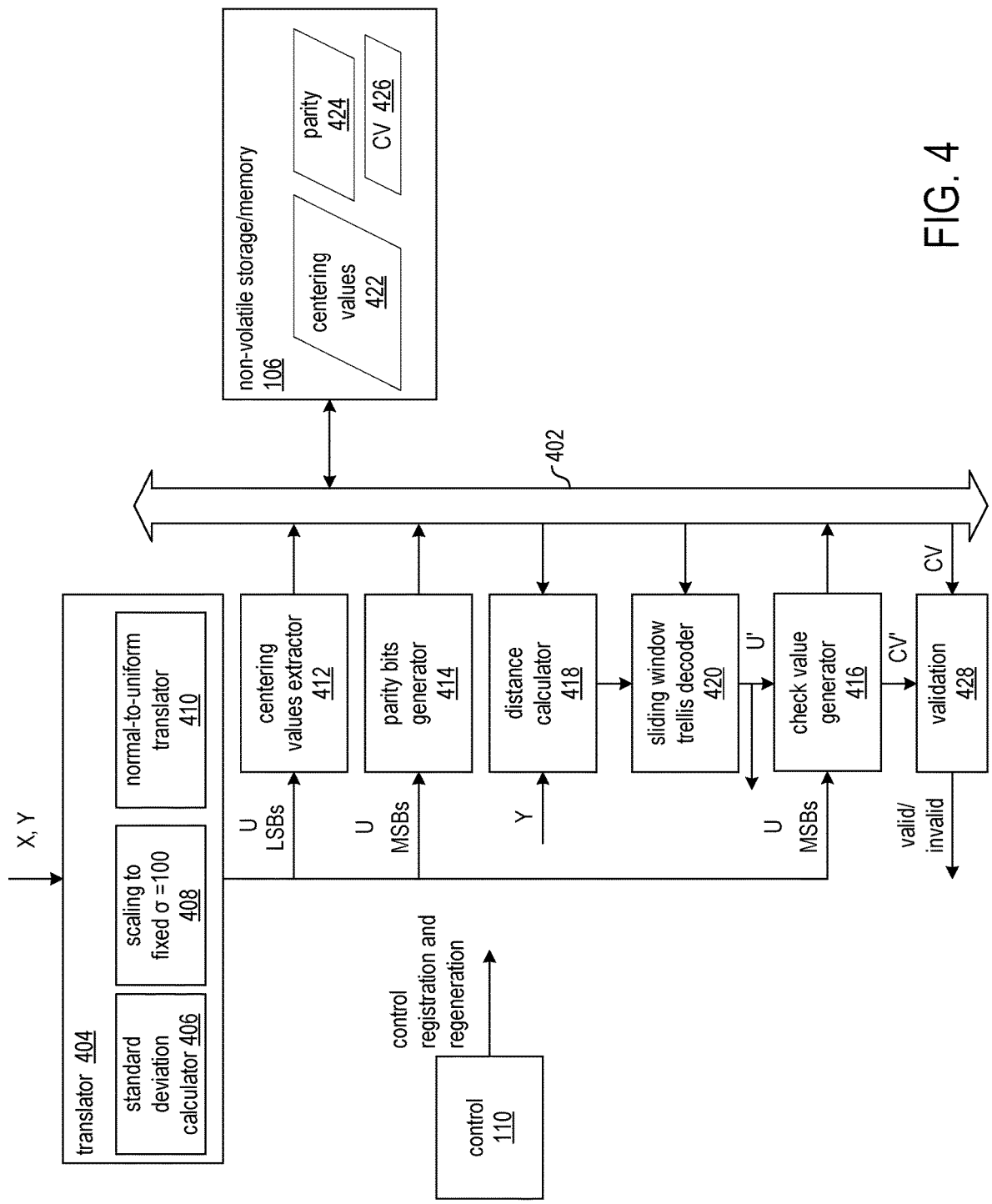
FIG. 4 shows an exemplary circuit arrangement that implements logic for PUF registration and PUF regeneration.

FIG. 4 shows an exemplary circuit arrangement that implements logic for PUF registration and PUF regeneration. The control logic 110 is communicatively coupled to all the logic circuits in order to enable and disable PUF registration and PUF regeneration. The bus 402 carries data and address signals for writing to and reading from non-volatile storage 106. The bus can be structured as a hierarchy depending on the location of the non-volatile storage relative to the logic circuits.

The circuitry for implementing PUF registration regeneration exemplary circuit arrangement includes translator 404, centering values extractor 412, parity bits generator 414, check value generator 416, distance calculator 418, trellis decoder 420, and validation logic 428. The translator 404 centering values extractor 412, parity bits generator 414, and check value generator 416 are involved in PUF registration. For PUF regeneration, the translator 404, distance calculator, trellis decoder 420, check value generator, and validation logic are involved.

The translator 404 generally converts normally distributed raw sample values, which may have been quantized to the [−512, 511] domain, to uniformly distributed symbols. The translator includes a standard deviation calculator 406, scaling logic 408, and a normal-to-uniform translator 410. The translator operates in both registration and regeneration modes.

The standard deviation calculator 406 can be implemented by adders and circuits that shift by 2 bits. The standard deviation can be estimated using the mean of the absolute values of the sample values, which is equivalent to the mean of a folded normal distribution. The folded normal distribution is sqrt(2/π)*σ where σ is the standard deviation of the sample. Therefore σ=mean(abs(X))*sqrt(π/2) or σ~= (5/4)*mean(abs(X)). The division by 4 is a shift by 2 bits and multiplication by 5 can be performed by a shifter and adder. The standard deviation calculator operates in both registration and regeneration modes.

The scaling logic 408 uses the estimated standard deviation of the sample to scale the sample values to a fixed standard deviation (e.g. 100), and the normal-to-uniform translator 410 can use a look-up table to translate the scaled sample values to binned values having a uniform distribution. The output values from the table are represented by b+c bits, where the b MSBs are used as a symbol of the PUF signature, and the c LSBs are used as centering values. The scaling logic operates in both registration and regeneration modes.

In response to operating in registration mode, the centering values extractor 412 inputs the c LSBs of each value in U and stores the groups of c bits as centering value in the non-volatile storage 106.

In response to operating in registration mode, the parity bits generator 414 inputs the b MSBs of each value in U and generates parity bits by performing an RSC on the sequence of values. The parity bits generator stores the generated parity bits in the non-volatile storage 106.

The check value generator 416 inputs the b MSBs of each value in U and uses a cryptographic hash function to generate a check value CV. The check value generator stores the check value 426 in non-volatile storage 106. The check value generator operates in both registration and regeneration modes The translator 404, distance calculator 418, trellis decoder 420, check value generator 416, and validation logic 428 are involved in PUF regeneration. The translator 404 converts the normally distributed raw sample values (Y) input for regeneration to uniformly distributed symbols.

In response to operating in regeneration mode, the distance calculator 418 inputs the raw sample values and reads the centering values 422 from the non-volatile storage 106. Based on the centering values and raw sample values, for each symbol of the PUF signature, the distance calculator generates a corresponding set of distance values in which each distance is associated with a candidate symbol.

The trellis decoder 420 inputs the sets of distances from the distance calculator and reads the associated parity bits 424 from the non-volatile storage 106, in response to operating in regeneration mode. The trellis decoder can be implemented as a sliding window trellis decoder that decodes each symbol of the PUF signature based on a window on the sets of distances, where the window covers fewer than all sets of distances and slides over the sets of distances in generating the symbols.

The sequence of decoded symbols of the PUF signature U' are output for use by an application (not shown) if the signature is valid. The PUF signature U' is also input to the check value generator 416, which generates check value CV' using the cryptographic hash function. The validation logic 428 reads the registration check value CV 426 from non-volatile storage 106 and compares CV to CV'. In response to CV=CV', the validation logic outputs a signal indicating the PUF signature is valid. In response to CV=CV', the validation logic outputs a signal indicating the PUF signature is not valid.

FIG. 5 shows windows of data input to an exemplary sliding window trellis decoder 420. Each window includes multiple sets of distances and parity bits associated with the sets of distances in the window. In the example, each window encompasses two sets of distances and two associated parity bits, and each set of distances includes 4 distances. Different window sizes and numbers of distances a set can be selected according to application requirements.

The example shows a sequence of 5 windows (window 0 through window 4) for decoding the first 5 PUF symbols (symbols of $u'_0$ through $u'_4$) of a sequence. In the first decoding cycle of the trellis decoder 420, the data of window 0 is input for decoding the symbol of $u'_0$. Window 0 includes the two sets of distances associated with centering values $C_0$ and $C_1$ and associated parity bits P0 and P1.

The trellis decoder decodes the symbol of $u'_0$ using the window 0 data in the first decoding cycle. Once decoding the symbol of $u'_0$ is complete, the trellis decoder inputs the data of window 1 to decode the symbol of $u'_1$. The decoding continues using successive windows of data to decode the symbols of $u'_2$ through $u'_n$. The window is advanced by one set of distances for each successive decoding cycle.

Figure 6:
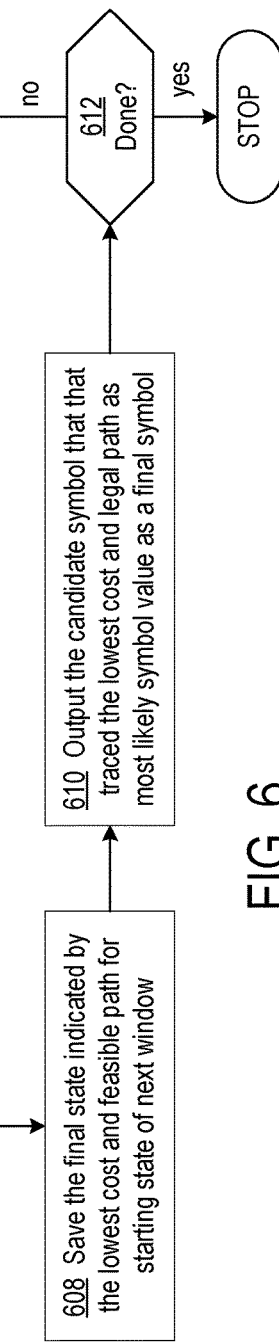
FIG. 6 shows a flowchart of an exemplary process performed by the sliding window trellis decoder.

FIG. 6 shows a flowchart of an exemplary process performed by the sliding window trellis decoder. At block 602, the trellis decoder inputs a window of data, which includes a number of sets of distances and the parity bits associated with the sets of distances.

The trellis decoder gets the starting state for decoding at block 604. For the first window (window 0), the starting state is 00 (in the example having 4 possible symbol values), and for subsequent windows the starting state is the final state indicated by in the decoding of the previous symbol using the previous window. Note that FIGS. 7, 8, and 9 show the states in an exemplary sliding window trellis decoder.

Beginning at the starting state, at block 606 determines the lowest cost path based on the sets of distances and associated parity bits of the input window. At block 608, the trellis decoder saves final state indicated by the lowest cost path, and at block 610 the trellis decoder outputs the candidate symbol that produced the lowest cost, legal path and the final symbol.

At decision block 612, trellis decoder (or control logic) determines whether or not all symbols have been decoded. If so, the decoder stops. Otherwise, the next window of data is input at block 602.

Figure 7:
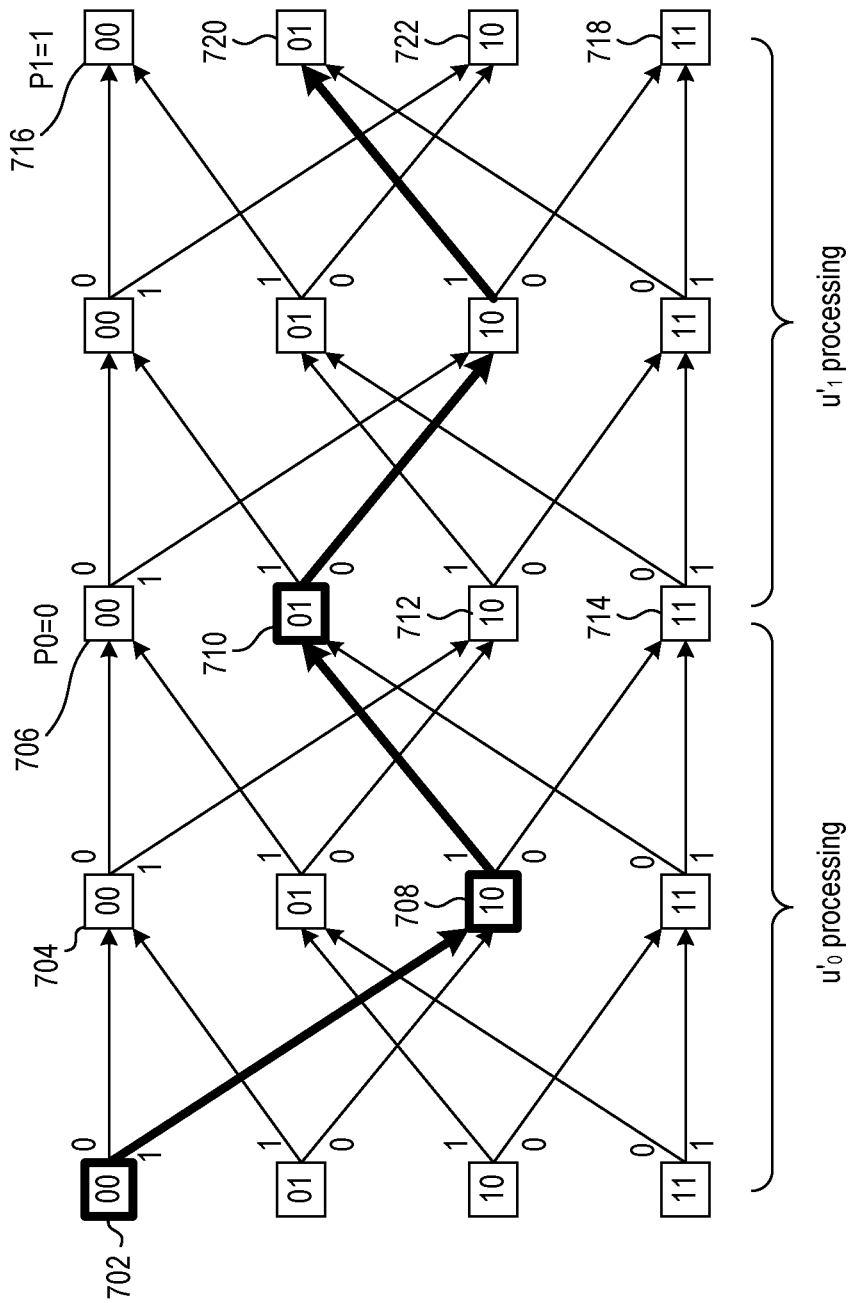
FIG. 7 shows the sliding window trellis decoding of a first symbol in a sequence.
Figure 8:
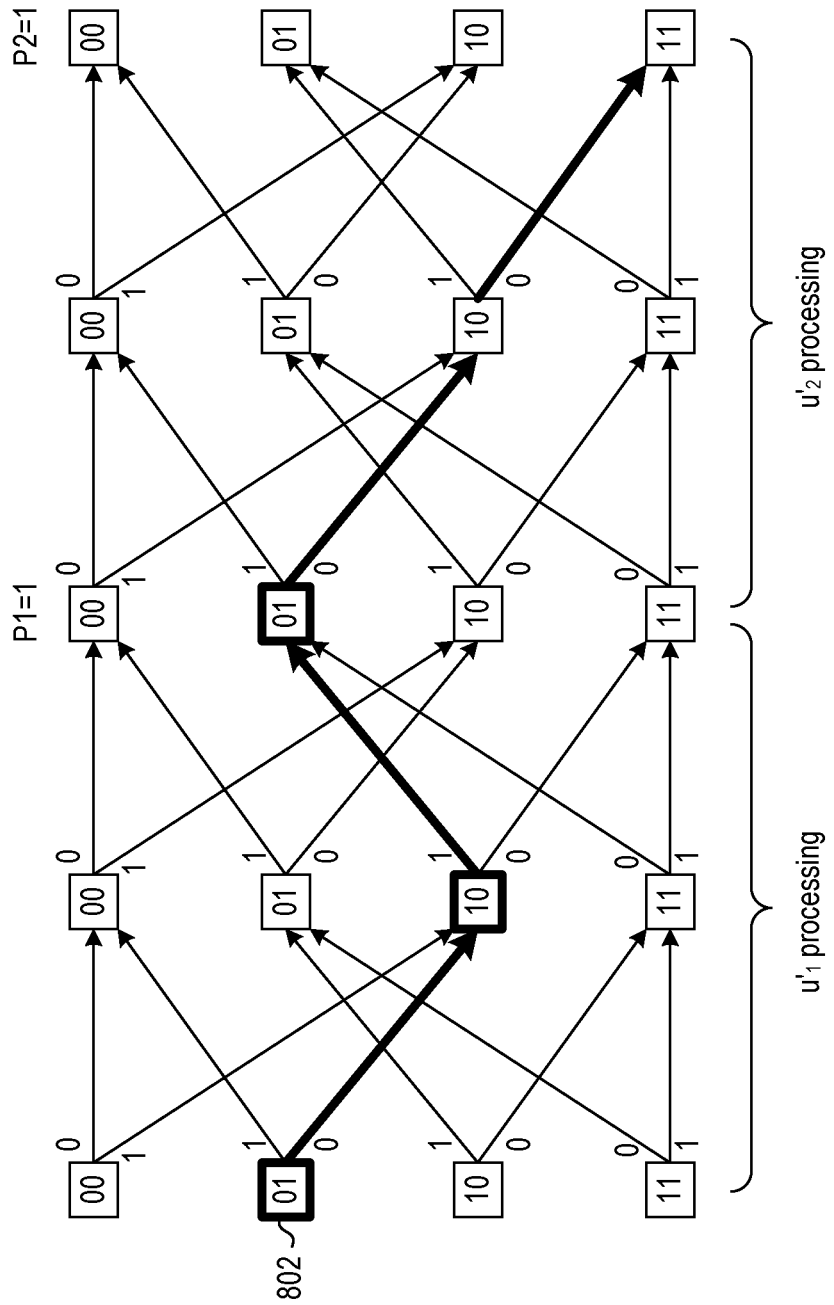
FIG. 8 continues the example of FIG. 7 and shows the sliding window trellis decoding of the second symbol in the sequence.
Figure 9:
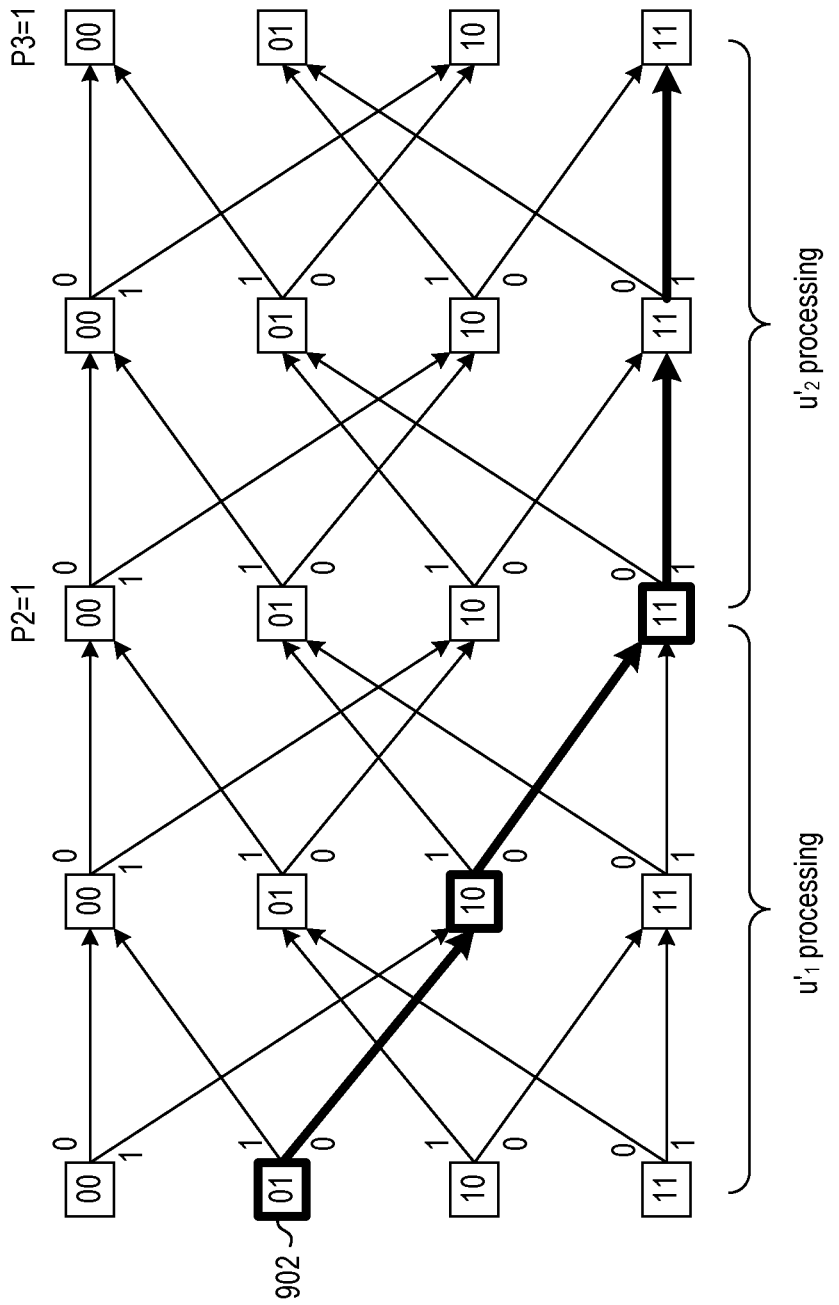
FIG. 9 continues the example of FIGS. 7 and 8 and shows the sliding window trellis decoding of the third symbol in the sequence.

FIGS. 7, 8, and 9 shown an example of a decoding of the first three symbols of a PUF signature using a sliding window trellis and a window moved to three positions to cover three input data sets. The associated parity bits are P0=0, P1=1, P2=1, and P3=0. The symbol of each $u'_i$ is decoded by examining 2 parity bits and 2 sets of 4 distance values, which are associated with candidate symbols 00, 01, 10, and 11.

For background, the RSC encoder transitions internal states based on the U symbol values. One state transition occurs for each bit within each U symbol value. Therefore, 10 U symbol values, each of size 2 bits, would result in 20 state transitions. The encoder outputs a single parity bit for each U symbol value. The RSC encoder starts with state 00 and appends the final state to the parity bits. The decoder determines the most likely U symbol values to create U' by finding the most likely sequence of RSC encoder states for each U' symbol value.

The blocks in FIGS. 7, 8, and 9 correspond to states of the RSC encoder. Each state of the exemplary RSC encoder has 2 bits of state, which corresponds to a constraint length of K=3. Other values of K are possible, for example K=5 and K=7 are common and can be useful depending on application requirements.

FIG. 7 shows the sliding window trellis decoding of a first symbol in a sequence. The trellis decoder starts at state 0, which is state 00 in the first column of blocks, because the first RSC encoder state was state 0. The last RSC encoder state can be determined by the decoder based on the final parity bits the encoder appended its final state at that location.

The decoder finds paths from the starting state 00 (block 702) through states of the trellis based on the bits of the candidate symbols 00, 01, 10, and 11. The decoder determines the most likely RSC encoder state to have occurred based on the sets of distances and the parity bits in the window.

The decoder finds the lowest cost legal path through the trellis. The cost of each path is a sum of the distances associated with legal segments of the path. Each segment of a path is traced by the values of the bits of the symbol associated with a distance of a set of distances in the window. The "legality" of a path is determined based on the parity bit associated with the set of distances.

Each segment is traced based on the bit values from the LSB to the MSB of the candidate symbol. For example, the segment traced for candidate symbol 00 from block 702 state 00 is from the state 00 (block 702) to the block 704 state 00 (LSB=0) and from block 704 state 00 to block 706 state 00 (MSB=0). Similarly, the segment traced for candidate symbol 11 is from block 702 state 00 to block 708 state 10 (LSB=1) and from block 708 state 10 to block 710 state 01 (MSB=1). The segments for candidate symbols 01 and 10 are similarly traced.

The parity bits indicate which states are legal and thereby which segments can form a legal path. For example, the parity bit P0=0 can indicate that the encoder state cannot be 00 (block 706) or 10 (block 712). The legality of encoder states is based on RSC encoder states that output that specific parity bit. In the example, RSC encoder states 00 and 10 (blocks 706 and 712) would have output a parity bit of P0=1 had the encoder transitioned through those states. However, the encoder output parity bit P0=0, which indicates that the RSC encoder did not transition through those states and those states are not possible. Therefore, possible paths through block 706 state 00 and paths through block 712 state 10 are not legal and are not considered in finding the lowest cost path. The trace continues through possibly legal paths through block 710 state 01 and block 714 state 01.

The costs of the paths up to block 710 state 01 and block 714 are the costs associated with the first set of distances in the window. For example, if $D_{0,C_0}=44$, $D_{1,C_0}=48$, $D_{2,C_0}=112$, and $D_{3,C_0}=189$, the costs of the legal paths are 48 to block 714 state 11 (candidate symbol 01) and 189 to block 710 state 01 (candidate symbol 11).

In the example, the decoding of $u'_0$ continues using the symbols 00, 01, 10, and 11, and associated distances in the second set of distances ($D_{0,C_1}$, $D_{1,C_1}$, $D_{2,C_1}$, and $D_{3,C_1}$) and the second parity bit P1=1, with paths beginning at block 710 state 01 and paths beginning block 714 state 11.

In tracing the paths from the legal states (block 710 state 01 and block 714 state 11), parity bit P1=1 restricts the legal states. For example if parity bit P1=1 indicates that the encoder state cannot be 00 or 11, then the paths to block 716 state 00 and paths to block 718 state 11 are not considered in finding the lowest cost path.

The distances of the paths from block 710 state 01 and block 714 state 11 to block 720 state 01 and block 722 state 10 are considered in finding the lowest cost path. The costs of the paths from block 710 state 01 and block 714 state 11 up to block 720 state 01 and block 722 state 10 are determined from distances of the second set of distances in the window ($D_{0,C_1}$, $D_{1,C_1}$, $D_{2,C_1}$, and $D_{3,C_1}$).

The costs of paths ending in block 720 state 01 and block 722 state 10 are compared to determine the lowest cost path. The costs of the paths from the block 702 state 00 to the legal end states of block 720 state 01 and block 722 state 10 are sums of the distances of the segments of the respective paths. The transitions from block 702 state 00 to block 710 state 01 form a segment, and the transitions from block 702 state 00 to block 714 state 11 form another segment. In the example, the segment from block 702 state 00 to block 710 state 01 has a distance of 189 ($D_{3,C_0}$), and the segment from block 702 state 00 to block 714 state 11 has a distance of 48 ($D_{1,C_0}$) as indicated above.

The segments from block 710 state 01 to block 720 state 01 and from block 710 state 01 to block 722 state 10 are traced by symbol values 10 and 11, which correspond to distances $D_{2,C_1}$ and $D_{3,C_1}$, respectively, in the second set of distances. The segments from block 714 state 11 to block 720 state 01 and from block 714 state 11 to block 722 state 10 are based on symbol values 01 and 00, which correspond to distances $D_{1,C_1}$ and $D_{0,C_1}$, respectively, in the second set of distances.

The trellis decoder computes the costs the legal paths and selects the lowest cost path to find the decoded symbol value. In the example, there are 4 legal paths through the trellis. The 4 paths, specified by the sequence of states from left to right in the trellis, are as follows as: path1=00-10-01-10-01; path2=00-10-01-00-10; path3=00-10-11-11-01; and path4=00-10-11-01-10. Each path has two segments and corresponds to one U' symbol. The first segment of path1 and path2 is traced by the sequence of states, 00-10-01. The distance of this segment is 189 ($D_{3,C_0}$). The second segment of path1 is traced by the sequence of states, 01-10-01, and the distance is $D_{2,C_1}$. The second segment of path2 is traced by the sequence of states, 01-00-10, and the distance is $D_{3,C_1}$. The first segment of path3 and path4 is traced by the sequence of states 00-10-11 and has a distance of 48 ($D_{1,C_0}$=48). The second segment of path3 is traced by the sequence of states, 11-11-01, and the distance is $D_{1,C_1}$. The second segment of path4 is traced by the sequence of states, 11-01-10, and the distance is $D_{0,C_1}$.

The decoder computes the costs of the paths in the example as follows:

$$\text{cost(path1)} = 189 + D_{2,C1}$$

$$\text{cost(path2)} = 189 + D_{3,C1}$$

$$\text{cost(path3)} = 48 + D_{1,C1}$$

$$\text{cost(path4)} = 48 + D_{0,C1}$$

The decoder finds the path having the least cost, for example path1, which is shown as a bold line in FIG. 7. The symbol that traced the first segment in the lowest cost path is output by the decoder as the decoded symbol. In the example, symbol $u'_0$=11 is the decoded symbol.

The final decoder state is used as the starting state by the decoder in decoding the next symbol using the sets of distances and associated parity bits in the next window of data. The final decoder state is the state that terminates the first segment in the lowest cost path. In the example, the final decoder state is block 710 state 01, and is state 01 is used as the starting state by the trellis decoder as shown in FIG. 8

FIG. 8 continues the example of FIG. 7 and shows the sliding window trellis decoding of the second symbol in the sequence. The decoder finds the lowest cost legal path through the trellis in much the same manner as described for FIG. 7. One difference is that the starting state for decoding the second window is shown by block 802 state 01, which was the final decoding state from decoding the first window. The other differences are that the second window includes the second and third sets of distances [$D_{0,C_1}$, $D_{1,C_1}$, $D_{2,C_1}$, $D_{3,C_1}$] and [$D_{0,C_2}$, $D_{1,C_2}$, $D_{2,C_2}$, $D_{3,C_2}$] and associated parity bits P1 and P2. The decoded symbol of $u'_1$ is 10, and the final decoder state from the second window is 01, which is used to start decoding using the third window.

FIG. 9 continues the example of FIGS. 7 and 8 and shows the sliding window trellis decoding of the third symbol in the sequence. The starting state for decoding the third window is shown by block 902 state 01, which was the final decoding state from decoding the second window. The third window includes the third and fourth sets of distances [$D_{0,C_2}$, $D_{1,C_2}$, $D_{2,C_2}$, $D_{3,C_2}$] and [$D_{0,C_3}$, $D_{1,C_3}$, $D_{2,C_3}$, $D_{3,C_3}$] and associated parity bits P2 and P3. The decoded symbol $u'_2$ is 00, and the final decoder state from the third window is 11, which is used to start decoding using the fourth window.

The window size involving 2 symbols is exemplary. Windows sizes that are on the order of twice the constraint length K of the RSC encoder are contemplated. For example, a window size involving 10 symbols is contemplated for an RSC encoder with K=5. A constraint length of K=5 can provide a suitable balance between a small size and suitable noise immunity. A K=5 implementation would use 16 encoder states and the sliding window would include 10 parity bits and 10 sets of 16 distances (160 distances in total) to calculate each symbol of U'. The size of the sliding window shrinks at the end of the data block because there are no more parity bits or data. Instead the decoder uses the knowledge that the final state is based on the final K−1 parity bits that the encoder appended. Selection of the window size is based on the specific needs of the application in which the PUF resides.

Various logic may be implemented as circuitry to carry out one or more of the operations and activities described herein and/or shown in the figures. In these contexts, a circuit or circuitry may be referred to as "logic," "module," "engine," "generator," "decoder," "translator," "calculator", "block" etc. It should be understood that these descriptors and other descriptors used herein refer to circuits that carry out one or more of the operations/activities. In certain implementations, a programmable circuit is one or more computer circuits programmed to execute a set (or sets) of instructions stored in a read-only memory (ROM) or random access memory (RAM) and/or operate according to configuration data stored in a configuration memory.

Though aspects and features may in some cases be described in individual figures, it will be appreciated that features from one figure can be combined with features of another figure even though the combination is not explicitly shown or explicitly described as a combination.

The circuit arrangements and methods are thought to be applicable to a variety of systems for implementing PUFs having different entropy sources that generate a raw PUF sample having a normal distribution. Other aspects and features will be apparent to those skilled in the art from consideration of the specification. The circuit arrangements and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
a translator circuit configured to translate a sequence of raw sample values having a normal distribution into a sequence of initial symbols having a uniform distribution across a plurality of sub-bins of a plurality of bins;
a distance calculator circuit configured to generate a set of distances from each raw sample value, respectively, based on a centering value associated with the raw sample value, wherein each distance in each set of distances is associated with a candidate symbol identifying one bin of the plurality of bins, and indicates a difference between the respective raw sample value and a raw sample value equivalent to a midpoint uniform value of a sub-bin offset by the associated centering value in the one bin of the plurality of bins; and a trellis decoder circuit configured to generate a physically unclonable function (PUF) signature based on the candidate symbols, the set of distances, and parity bits.

2. The circuit arrangement of claim 1, wherein the PUF signature is a sequence of final symbols, and the circuit arrangement further comprising:

a check value generator circuit configured to generate a regeneration check value based on the sequence of final symbols; and a validation circuit configured to generate a signal that indicates whether or not the PUF signature is valid based on the regeneration check value and a registration check value.

3. The circuit arrangement of claim 1, wherein:

the PUF signature is a sequence of final symbols numbered 0 through n−1;

the parity bits include parity bits corresponding to the final symbols, respectively; and the trellis decoder circuit is configured to determine a final symbol i of the sequence of final symbols based on the sets of distances and candidate symbols generated from raw sample value i through raw sample value i+j of the sequence of raw sample values and on parity bits corresponding to final symbol i through final symbol i+j of the sequence of final symbols for i≥ 0 and j≥ 2.

4. The circuit arrangement of claim 1, wherein each raw sample value in the sequence of raw sample values is a difference between counted oscillations of a pair of ring oscillators.

5. The circuit arrangement of claim 1, wherein each raw sample value in the sequence of raw sample values is a difference in voltage between arrays of capacitors.

6. The circuit arrangement of claim 1, wherein:

the PUF signature is a sequence of final symbols;

the trellis decoder circuit, for each final symbol of the sequence of final symbols, is configured to:

determine legal paths through states of a trellis based on the candidate symbols and the parity bits;

calculate costs of the legal paths based on the distances associated with the candidate symbols; and determine a symbol of the candidate symbols to be the final symbol in response to a legal path of the legal paths having a lowest cost of the costs of the legal paths.

7. The circuit arrangement of claim 1, further comprising an entropy source circuit configured to generate the sequence of raw sample values in response to a sample of measurements of a physical phenomenon having a normal distribution.

8. The circuit arrangement of claim 1, wherein the translator circuit includes a scaling circuit configured to scale the sequence of raw sample values based on a standard deviation of the normal distribution of the raw sample values.

9. A method of registering a physically unclonable function (PUF), comprising:

translating a sequence of raw sample values having a normal distribution into a sequence of binned values having a uniform distribution across a plurality of sub-bins of a plurality of bins by a translator circuit;

generating helper data by a helper circuit and storing the helper data in a memory circuit, wherein the helper data includes centering values, and parity bits based on the sequence of binned values, wherein each centering value is associated with a raw sample value corresponding to a binned value of the sequence of binned values and indicates an offset of a sub-bin in one of the plurality of bins; and generating a check value based on symbols represented in the sequence of binned values by a check value generator circuit and storing the check value in the memory circuit.

10. The method of claim 9, wherein the translating includes looking up in the memory circuit, binned values in the sequence of binned values.

11. The method of claim 10, wherein each binned value in the memory circuit is represented by b+c bits, b most significant bits of each binned value are a symbol that represents a PUF response value, and c least significant bits of each binned value are a centering value.

12. The method of claim 11, wherein generating the helper data incudes performing a recursive systematic convolution on the symbols of the sequence of binned values to generate the parity bits.

13. The method of claim 12, wherein generating the helper data includes appending parity bits to the parity bits generated by the recursive systematic convolution to encode a final state that enables decoding during PUF regeneration.

14. The method of claim 9, wherein generating the check value includes the check value generator circuit performing a one-way function that generates the check value in response to the symbols.

15. A circuit arrangement comprising:

a translator circuit configured to translate, in response to operating in a registration mode, a first sequence of raw sample values having a normal distribution into a first sequence of binned values having a uniform distribution across a plurality of sub-bins of a plurality of bins, and to translate, in response to operating in a regeneration mode, a second sequence of raw sample values having a normal distribution into a second sequence of binned values having a uniform distribution across the plurality of sub-bins of the plurality of bins;

a memory circuit configured to provide non-volatile storage of data;

a helper circuit configured to generate helper data and store the helper data in the memory circuit in response to operating in the registration mode, wherein the helper data includes centering values, and parity bits based on the first sequence of binned values, wherein each centering value is associated with a raw sample value corresponding to a binned value of the first sequence of binned values and indicates an offset of a sub-bin in one of the plurality of bins;

a check value generator circuit configured to generate a first check value based on symbols represented in the first sequence of binned values and store the first check value in the memory circuit in response to operating in the registration mode;

a distance calculator circuit configured to generate, in response to operating in the regeneration mode, a set of distances from each raw sample value, respectively, based on the centering value associated with the raw sample value, wherein each distance in each set of distances is associated with a candidate symbol identifying one bin of the plurality of bins, and indicates a difference between the respective raw sample value and a raw sample value equivalent to a midpoint of a sub-bin offset by the associated centering value in the one bin of the plurality of bins;

a trellis decoder circuit configured to generate, in response to operating in the regeneration mode, a physically unclonable function (PUF) signature that includes a sequence of final symbols based on the candidate symbols, the set of distances, and parity bits from the memory circuit;

wherein the check value generator circuit is configured to generate a second check value based on the sequence of final symbols in response to operating in the regeneration mode; and a validation circuit configured to indicate validity of the PUF signature based on the first check value and the second check value.

16. The circuit arrangement of claim 15, wherein:
the translator circuit is configured to look up in the memory circuit, binned values in the sequence of binned values; and
each binned value in the memory circuit is represented by b+c bits, b most significant bits of each binned value are a symbol that represents a PUF response value, and c least significant bits of each binned value are a centering value.

17. The circuit arrangement of claim 16, wherein the helper circuit is configured to perform a recursive systematic convolution on the symbols of the first sequence of binned values to generate the parity bits.

18. The circuit arrangement of claim 15, wherein:
the PUF signature is a sequence of final symbols numbered 0 through n−1;
the parity bits include parity bits corresponding to the final symbols, respectively; and
the trellis decoder circuit is configured to determine a final symbol i of the sequence of final symbols based on the sets of distances and candidate symbols generated from raw sample value i through raw sample value i+j of the sequence of raw sample values and on parity bits corresponding to final symbol i through final symbol i+j of the sequence of final symbols for i≥0 and j≥ 2.

19. The circuit arrangement of claim 15, wherein:
the PUF signature is a sequence of final symbols;
the trellis decoder circuit, for each final symbol of the sequence of final symbols, is configured to:
determine legal paths through states of a trellis based on the candidate symbols and the parity bits;
calculate costs of the legal paths based on the distances associated with the candidate symbols; and
determine a symbol of the candidate symbols to be the final symbol in response to a legal path of the legal paths having a lowest cost of the costs of the legal paths.

20. The circuit arrangement of claim 15, wherein the check value generator circuit is configured to perform a one-way function that generates the first check value based on the symbols represented in the first sequence of binned values, and that generates the second check value based on the sequence of final symbols.

* * * * *